United States Patent
Fan et al.

(10) Patent No.: US 6,425,327 B1
(45) Date of Patent: Jul. 30, 2002

(54) METHOD FOR FORMING A CYLINDRICAL PHOTOSENSITIVE ELEMENT

(75) Inventors: Roxy Ni Fan, Warren, NJ (US); William John Hommes, Hockessin, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/372,475

(22) Filed: Aug. 12, 1999

(51) Int. Cl.[7] .............................. B41C 1/18; G03F 7/18
(52) U.S. Cl. ...................... 101/401.1; 101/375; 492/18; 492/46; 492/49; 29/895.23
(58) Field of Search ................... 101/375, 376, 101/395, 401.1, 487; 492/18, 46, 48, 49, 56; 29/895.23; 430/271.1

(56) References Cited

U.S. PATENT DOCUMENTS

| | | | |
|---|---|---|---|
| 4,337,220 A | 6/1982 | Arimatsu | 264/25 |
| 5,171,404 A * | 12/1992 | Ellis et al. | 162/206 |
| 5,206,992 A * | 5/1993 | Carlson et al. | 101/376 |
| 5,383,833 A * | 1/1995 | Brugger et al. | 492/46 |
| 5,595,115 A * | 1/1997 | Rau et al. | 101/487 |
| 5,706,731 A * | 1/1998 | Francille et al. | 101/375 |
| 5,782,181 A | 7/1998 | Rossini | 101/153 |
| 5,798,019 A | 8/1998 | Cushner et al. | 156/425 |
| 5,813,334 A * | 9/1998 | Blanchard | 101/487 |
| 5,819,657 A | 10/1998 | Rossini | 101/376 |
| 5,904,095 A * | 5/1999 | Nelson | 101/375 |
| 5,916,403 A | 6/1999 | Cushner et al. | 156/244 |
| 5,984,848 A * | 11/1999 | Hyllberg et al. | 492/46 |

FOREIGN PATENT DOCUMENTS

| | | |
|---|---|---|
| EP | 0111371 A2 | 6/1984 |
| EP | 0 440 079 A2 | 8/1991 |
| EP | 0766143 A1 | 4/1997 |
| EP | 0 732 201 B1 | 1/1999 |

* cited by examiner

Primary Examiner—Stephen R. Funk
(74) Attorney, Agent, or Firm—Thomas H. Magee

(57) ABSTRACT

A method for forming a seamless cylindrical photosensitive element on a flexible cylindrical sleeve wherein the flexible sleeve is mounted onto a sleeve support to isolate the flexible sleeve from high temperature and/or high pressure associated with forming a cylindrical photosensitive layer on the flexible sleeve.

16 Claims, 2 Drawing Sheets

METHOD FOR FORMING A CYLINDRICAL PHOTOSENSITIVE ELEMENT

BACKGROUND OF THE INVENTION

1. Field of the Invention

This invention pertains to a method for forming a cylindrical photosensitive element and, in particular, a method for forming a seamless cylindrical photopolymerizable element suitable for use as a flexographic printing element.

2. Description of Related Art

Photopolymerizable materials can be formed into sheets or layers by several known methods such as solvent casting, hot pressing, calendering and extrusion. A preferred method of forming photopolymerizable materials for use as flexographic printing elements is by extrusion calendering the photopolymerizable material. In extrusion calendering, the printing element is prepared by passing a mass of hot photopolymerizable material into an extrusion die forming a layer, passing the layer into the nip of a calender and, while still hot, calendering the photopolymerizable material between two flat surfaces, generally two flexible films, to form a multilayer web. The films can include multiple layers or compound films. A film bearing a thin layer of flexible, polymeric film is an example of a compound film. After extrusion and calendering at elevated temperatures, the web is held in tension in the machine direction by a pair of nip rollers while the multilayer web is cooled, for example, with blown air. The printing element as a multilayer web can be cut into suitable size sheets. Extrusion and calendering of a polymeric compositions are disclosed, for example, in Gruetzmacher et al., U.S. Pat. No. 4,427,759; and in Min, U.S. Pat. No. 4,622,088.

Although typically photopolymerizable printing elements are used in sheet form, there are particular applications and advantages to using the printing element in a continuous cylindrical form. Continuous printing elements have applications in the flexographic printing of continuous designs such as in wallpaper, decoration and gift wrapping paper, and tight-fit conditions for registration, since the designs can be easily printed without print-through of the plate seam. Furthermore, such continuous printing elements are well-suited for mounting on laser exposure equipment where it can replace the drum or be mounted on the drum for exposure by a laser to achieve precise registration.

The formation of seamless, continuous printing elements can be accomplished by several methods. The photopolymerizable flat sheet elements can be reprocessed by wrapping the element around a cylindrical form, usually a printing sleeve or the printing cylinder itself, and fusing or joining the edges together to form a seamless, continuous element. Processes for joining the edges of a plate into a cylindrical form have been disclosed, for example, in German patent DE 28 44 426, United Kingdom patent GB 1 579 817, European patent application EP 0 469 375, U.S. Pat. No. 4,883,742, and U.S. Pat. No. 4,871,650. A problem with the prior methods of joining the edges to form the continuous cylinder is that the results of printing with the joined edge element are often unsatisfactory, particularly when the joined edge falls within the effective printing area of the plate. Although the prior art often describes the so-formed continuous element as "seamless", the joined seam has not completely formed a continuum of the photopolymerizable layer at the edges since the joined seam is visible in and interrupts the printed image.

U.S. Pat. No. 5,798,019 discloses an apparatus and a process for forming a cylindrical photosensitive element of uniform thickness on a flexible sleeve without sanding, grinding or additional polishing steps. The method involves supplying a stream of molten photopolymerizable material onto the sleeve supported directly on a mandrel, calendering the molten photopolymerizable material to have a substantially constant thickness on the sleeve, moving the sleeve around and along the mandrel in a helical fashion to polish an outer surface of the element, and during the calendering step, heating the photopolymerizable material. In a first mode, the flexible sleeve is mounted on an air lubricated mandrel such that the air permits the rotational and axial movement of the flexible sleeve with preferably at least two calender rolls positioned around the sleeve at a predefined clearance, approximately equal to the desired thickness of the photopolymerizable material on the sleeve. The stream of molten photopolymerizable material is fed into a gap between the sleeve and a calender roll. Once there is coverage of the photopolymerizable material around the circumference of the sleeve, the contact of the photopolymerizable material with the calender rolls will rotate the sleeve. At the same time, the sleeve is pushed laterally along the mandrel causing the polymerizable material to be wrapped spirally around the sleeve. The length of the resulting cylindrical photosensitive element is longer than the calendering roll/s. In a second mode, the flexible sleeve is mounted onto a mandrel with the calender rolls positioned around the sleeve at the predefined clearance. A solid sheet of photopolymerizable material is fed into the gap between the sleeve and the calender roll. Once there is coverage of the photopolymerizable material around the circumference of the sleeve, the contact of the photopolymerizable material with the calender rolls will rotate the sleeve and mandrel together. In this mode, the calender rolls are the same length as or longer than the cylindrical element and thus there is no lateral movement of the sleeve along the mandrel.

However, the process of U.S. Pat. No. 5,798,019 is limited in its ability to produce a cylindrical photopolymerizable element on a flexible polymeric sleeve with acceptable dimensional uniformity in the mode where the sleeve rotates about the mandrel. The polymeric sleeve may also move laterally along the mandrel. It is desirable for the cylindrical photopolymerizable element to be made with a flexible polymeric sleeve because the sleeve is transparent to UV light, and therefore the element can be exposed through the back (i.e., the sleeve) to establish a floor thickness in the printing element. For example, the polymeric sleeve can be formed from polyester film, such as the sleeve disclosed by McConnell in U.S. Pat. No. 5,301,610. A problem arises during the formation process in that the flexible polymeric sleeve distorts uncontrollably and is not of uniform size and/or shape. In order to reduce the force required to both rotate and translate the flexible sleeve along the mandrel, the interface between the sleeve and the mandrel is lubricated using 5 to 60 psig compressed air. At the same time, the sleeve is at or near the elevated temperature associated with the molten photopolymer, and thus the air pressure between the polymeric sleeve and the mandrel causes the sleeve to balloon and permanently deform. Additionally, near the leading and trailing ends of the sleeve where the air pressure rapidly decreases to atmospheric pressure, the hot photopolymer causes the sleeve to shrink, thereby reducing the internal diameter of the sleeve at the ends. Distortion or non-uniformity of the sleeve will result in unacceptable interference fit of the cylindrical printing element with the printing cylinder. It is an -objective of the present invention to provide a method for forming a cylindrical photosensitive printing element having acceptable dimensional uniformity.

SUMMARY OF THE INVENTION

A method for forming a seamless cylindrical photosensitive element on a flexible cylindrical sleeve comprises:

supporting the sleeve on a substantially rigid and thermally stable sleeve support such that the sleeve and sleeve support act as a unitary structure, the sleeve support having a longitudinal axis and adapted to be mounted onto a mandrel;

supplying a substantially molten stream of photopolymerizable material onto the sleeve;

providing relative axial movement between the sleeve support and the supply of photopolymerizable material along the longitudinal axis of the sleeve support;

calendering the molten photopolymerizable material on the sleeve by metering with at least one rotating calender roll the photopolymerizable material to have a substantially constant thickness on the sleeve and rotating the sleeve support to polish an outer circumferential surface of the material to a seamless uniform state without sanding, grinding or additional polishing steps, thereby forming the seamless cylindrical photosensitive element; and during the calendering step, heating the photopolymerizable material.

In accordance with this invention, there is provided an intermediate element for making a seamless cylindrical printing element comprising:

a) a hollow cylindrical sleeve of at least one polymeric film mounted onto a substantially rigid and thermally stable sleeve support for maintaining the sleeve in a substantially cylindrical shape, the sleeve support adapted to be mounted onto a mandrel;

b) at least one seamless layer of a photopolymerizable material on an exterior surface of the sleeve; and c) optionally, an adhesive layer disposed between the sleeve and the at least one seamless layer or an exterior surface of the sleeve having an adhesion promoting surface.

DETAILED DESCRIPTION OF THE PREFERRED EMBODIMENT(S)

Figure 1:
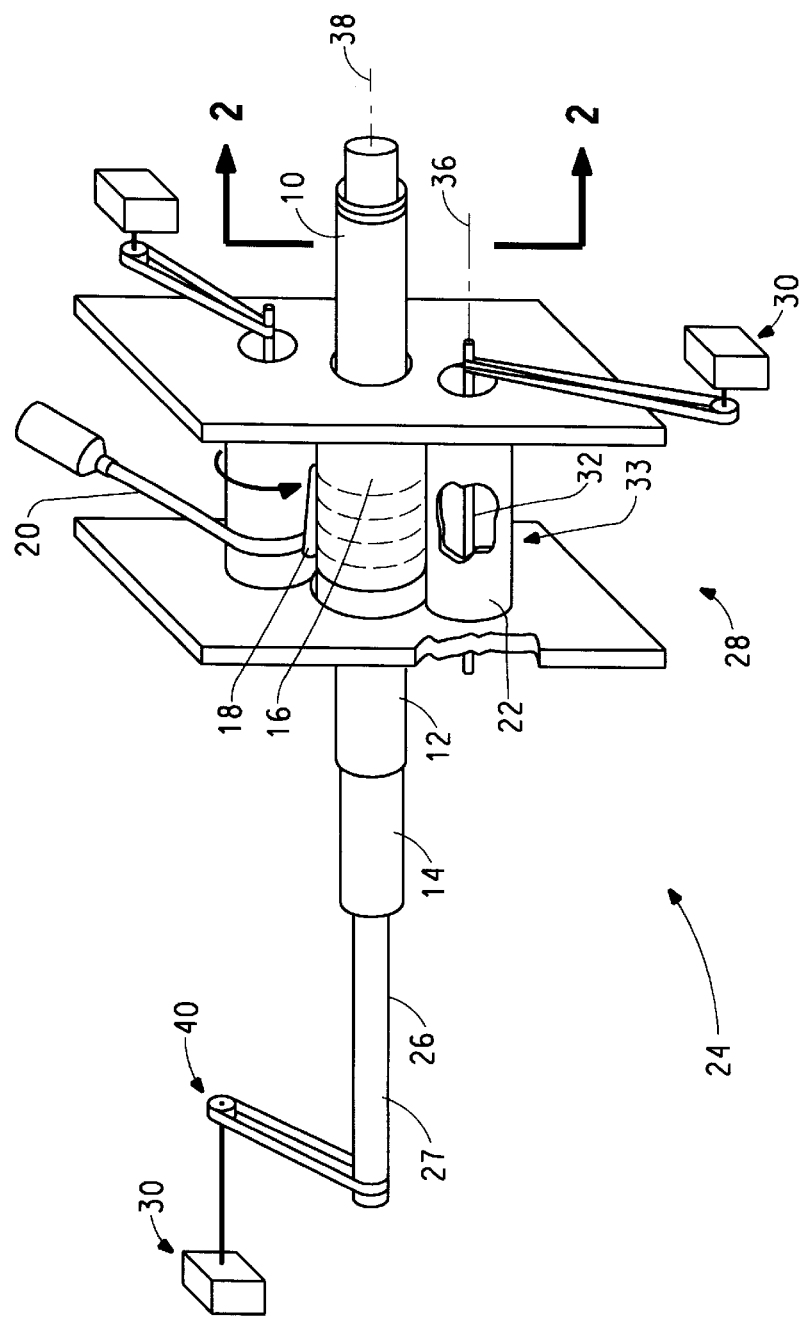
FIG. 1 is a diagrammatic perspective view of an apparatus for forming a seamless cylindrical photosensitive element on a flexible sleeve in accordance with the present invention.
Figure 2:
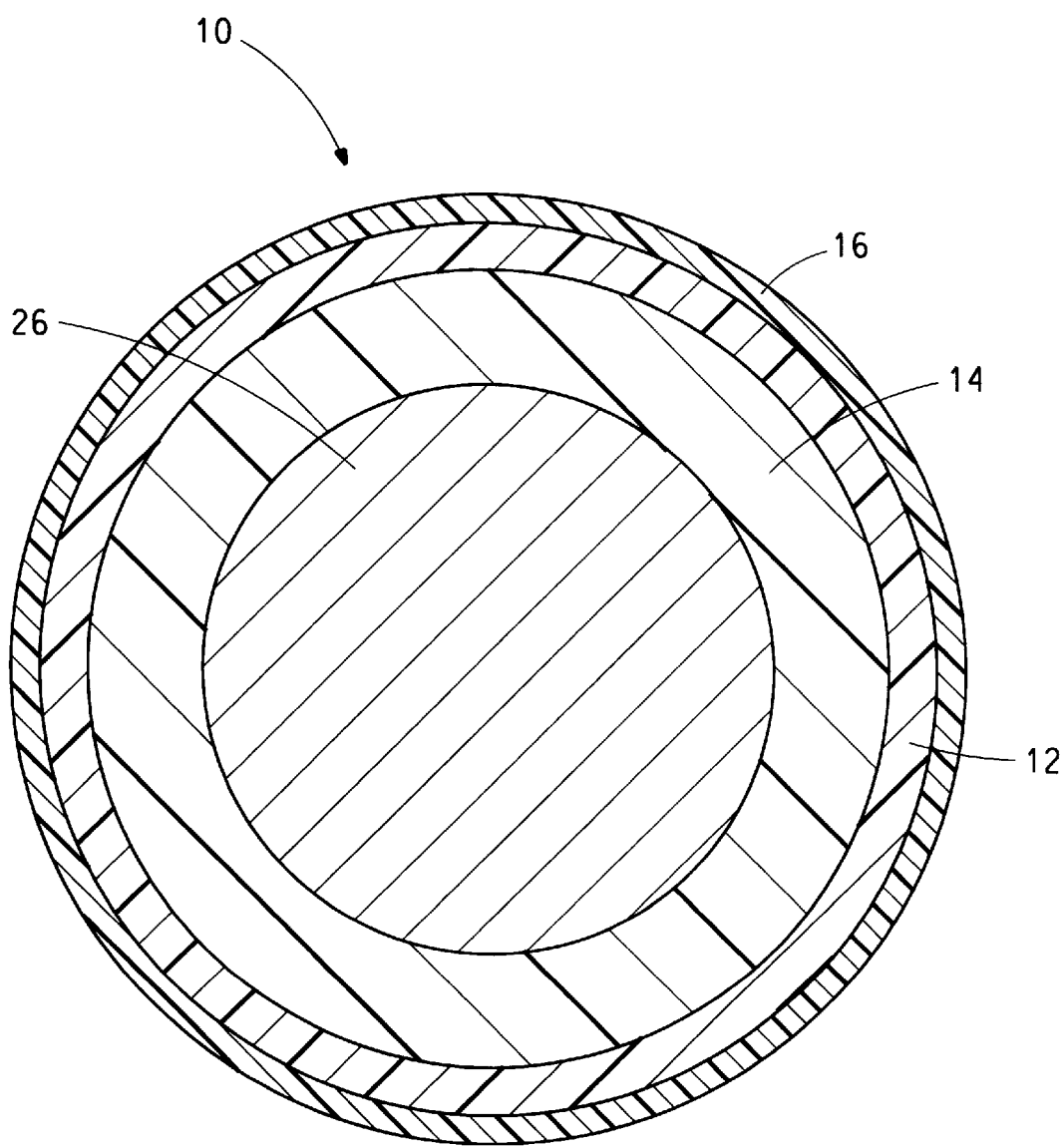
FIG. 2 is a cross-sectional view along line 2—2 in FIG. 1.

As shown in FIG. 1 and FIG. 2, the present invention provides a method for forming a seamless cylindrical photosensitive element 10 on a flexible cylindrical sleeve 12 which is mounted onto a substantially rigid and thermally stable sleeve support 14. Once mounted, the sleeve 12 and the sleeve support 14 act as a unitary structure during formation of a layer 16 of photopolymerizable material 18 on the sleeve 12. A substantially molten stream 20 of photopolymerizable material 18 is supplied onto the sleeve 12 and metered to a substantially constant thickness on the sleeve 12, with the use of at least one, preferably two or three, calender rolls 22 positioned around the flexible sleeve 12 at a predefined clearance, approximately equal to the desired thickness of the photopolymerizable material 18.

An apparatus suitable for carrying out the method of forming the seamless cylindrical photosensitive element is disclosed in U.S. Pat. No. 5,798,019 which is hereby incorporated by reference. The apparatus is similar to the apparatus 24 shown in FIG. 1 which comprises a mandrel 26, a calendering assembly 28, a drive system 30 and at least one heating element 32. The mandrel 26 has an outer surface 27 that may be lubricated by air or other fluids. The calendering assembly 28 includes at least one, preferably a plurality of calender roll assemblies 33, each which include the calender roll 22 having a longitudinal axis 36. The drive system 30 includes a means for moving the sleeve 12 around and along an axis 38 of the mandrel 26 by rotating the calender roll assemblies 33, and an optional mandrel drive mechanism 40 for rotating the mandrel 26.

The first step of the present method is supporting the flexible sleeve of the photosensitive element on a substantially rigid and thermally stable sleeve support. In a first embodiment, the sleeve support is used alone (without a mandrel) to support the flexible sleeve during the method for forming the cylindrical photosensitive element. The sleeve support has opposing ends which can be held in position in the apparatus by, for example, journals supported by bearings, as is conventional in the art. The sleeve support is capable of rotating while being held in position in the apparatus. A person of ordinary skill in the art can modify the apparatus of U.S. Pat. No. 5,798,019 to replace the mandrel with a means for holding the ends of the sleeve support in position and for rotating the sleeve support to form the cylindrical photosensitive element. In a second embodiment, the sleeve support is used with the mandrel to support the flexible sleeve during the method for forming the cylindrical photosensitive element. The sleeve support separates the flexible sleeve from an outer surface of the mandrel and isolates the flexible sleeve from air pressure or other means of lubrication used at the interface of the sleeve support and the mandrel. By separating and isolating the flexible sleeve from the conditions at the outer surface of the mandrel, the sleeve support maintains the flexible sleeve in a substantially cylindrical shape while forming the cylindrical printing element. Also, the presence of the sleeve support between the flexible sleeve and the mandrel can prevent the shrinkage of the flexible sleeve caused by the high temperature of the molten photopolymerizable material.

The sleeve support is cylindrically-shaped with a longitudinal axis and has an inner circumferential surface and an outer circumferential surface. In the second embodiment, the sleeve support fits to the mandrel with less than 0.05 mm (0.002 inch) of clearance between the inner circumferential surface of the sleeve support and the outer surface of the mandrel. The sleeve support can include a means for mounting and transporting the sleeve support on the mandrel. One means for mounting and transporting the sleeve support can include one or more bushings which are conventional in the art, positioned on the inner circumferential surface of the sleeve support. The bushings, which are rotary and linear bushings, allow the sleeve support to transport, that is to rotate and slide, freely along the mandrel. The bushings may be coated with an antifriction material, such as TEFLON® fluorocarbon resin, to improve the transportability of the sleeve support on the mandrel. The interface created between the inner circumferential surface of the sleeve support and the outer surface of the mandrel can also be lubricated with air or other fluids in conjunction with the bushings. The sleeve support can be mounted onto the mandrel by other means such as linear ball bushings.

In the first and second embodiments, the flexible sleeve is supported on the sleeve support such that the sleeve and sleeve support act as a unitary structure. High pressure air of about 20 to 100 psig is provided via air passages opening to the outer circumferential surface of the sleeve support which provide for mounting and dismounting the flexible sleeve. The use of high pressure air to mount and dismount a sleeve onto a printing cylinder is conventional in the art, and in a similar way the flexible sleeve is mounted and dismounted onto the sleeve support. Once the flexible sleeve is mounted onto the sleeve support, the air is turned off, the flexible sleeve contracts and thereby is secured to the sleeve support with an interference fit. In this way, the flexible sleeve will not move on or about the sleeve support and the sleeve and sleeve support function as a unitary structure during subsequent steps. The flexible sleeve and sleeve support will move together as a single element when the sleeve support is rotated and/or when the sleeve support is moved axially along its longitudinal axis. Since the flexible sleeve is secured to the sleeve support, the need for air lubricant to move the flexible sleeve in an expanded state about a mandrel is eliminated, and thereby the flexible sleeve is prevented from shrinking or expanding uncontrollably or otherwise distorting.

The sleeve support has an axial length which is at least as long as that of the flexible sleeve. The axial length of the sleeve support may be the same as or shorter than the axial length of the mandrel. In the second embodiment, preferably the length of the mandrel is longer than the sleeve support by at least the length of the cylindrical photosensitive element.

The sleeve support is substantially rigid and thermally stable in order to adequately support the flexible sleeve during the present method. The sleeve support must be substantially rigid such that it does not change dimensionally when in use. Since the heat associated with the molten photopolymerizable material transmits readily through the flexible sleeve to the sleeve support, the sleeve support must be thermally stable so that it does not distort or change shape or size while supporting the flexible sleeve. The sleeve support must be stable to temperatures at least as high as that of the molten polymerizable material, that is stable at least to a temperature of 180° C., and preferably stable to 250° C.

The sleeve support can be made of any material or composite which provides the desired rigidity and thermal stability. Examples of materials suitable for the sleeve support include, but are not limited to, metals, such as steel and aluminum; composites, such as carbon-fiber reinforced resins; and thermoset polymeric materials, such as epoxy. Preferably, the sleeve support is made of a material with high thermal conductivity to allow quick cooling of the polymer-coated flexible sleeve while on the sleeve support. Preferred materials for the sleeve support are steel or carbon-fiber reinforced resins. It is also contemplated that the sleeve support can be formed of two or more cylindrically-shaped elements which fit together with an interference fit. The two or more cylindrically-shaped elements can be from the same or different materials, and can have different thicknesses.

The thickness of the sleeve support is the radial difference between the inner circumferential surface and the outer circumferential surface. The thickness of the sleeve support is not particularly critical so long as the sleeve support has the desired rigidity and can securely hold the flexible sleeve with an interference fit. Preferably the thickness of the sleeve support is between 0.098 and 12.7 cm (0.25 and 5.0 inches).

Further, it is advantageous from a manufacturing view, to have available several sleeve supports each having a different thickness. It is easier and quicker to mount the sleeve supports in the apparatus or on a mandrel than to change out the mandrel itself in order to accommodate producing the flexible seamless cylindrical photosensitive element on flexible sleeves of different internal diameters.

The sleeve support may optionally include a means for controlling the temperature of the sleeve support. To improve the repeatability of the method of forming the seamless cylindrical photosensitive element, it is desirable for the temperature of the sleeve support, flexible sleeve, and photopolymerizable material to be repeatable as possible. The means for controlling the temperature of the sleeve support includes one or more passages in an area between the inner circumferential surface and the outer circumferential surface in which a temperature controlling medium, such as air or a liquid, can traverse. The passages as means for controlling the temperature of the sleeve would not open to the outer circumferential surface of the sleeve support. At start-up, the temperature controlling medium may be hot to heat the sleeve support to a temperature close to that of the molten photopolymerizable material. As the process proceeds, it may be necessary to cool the sleeve support to maintain a consistent temperature at the polymer-coated flexible sleeve while on the sleeve support.

The flexible sleeve carries the photopolymerizable layer and provides the cylindrical element with the capability to be readily mounted and dismounted from the sleeve support as well as from printing cylinders. The flexible sleeve must be able to grip the sleeve support (outer circumferential surface) without slippage. Typically an interference fit with the print cylinder of 3 to 15 mils is preferred. The sleeves should be expandable with the 20 to 100 psig air generally available in printing facilities and should expand sufficiently so they are easily slid over the sleeve support, so that an expansion exceeding the amount of interference fit is required. The sleeve should have an outer surface free from irregularities that cause printing defects, and should have a uniform wall thickness which results in a difference in diameter (i.e., trueness) of the outer wall surface when mounted on the sleeve support of less than 5 mils and preferably less than 1 mil.

The sleeve can be made of any flexible material which is conventionally used as a support for photosensitive elements used to prepare flexographic printing plates. Examples of suitable support materials include polymeric films, such as those formed by addition polymers and linear condensation polymers, and foams and fabrics, such as fiberglass. Other flexible materials suitable for use as a sleeve include polystyrene and polyvinyl resins, such as polyvinyl chloride and polyvinyl acetate. The method of the present invention is particularly useful for sleeves made of polymeric films. A preferred polymeric film for a sleeve is polyester film, particularly polyethylene terephthalate. Flexible sleeves made of polymeric films are preferred as they typically are transparent to ultraviolet radiation and thereby accommodate backflash exposure for building a floor in the cylindrical printing element. The sleeve may be formed from a single layer or multiple layers of flexible material provided that the sleeve has the above-described characteristics. Multiple layered sleeves may include an adhesive layer or tape between the layers of flexible material. Preferred is a multiple layered sleeve as disclosed in U.S. Pat. No. 5,301,610. The sleeve typically has a wall thickness from 0.025 to 0.203 cm (10 to 80 mils) or more. Other examples of sleeves suitable for use in the photosensitive element are disclosed by Bass et al. in U.S. Pat. No. 3,146,709 and by Hoage et al. in U.S. Pat. No. 4,903,597.

The flexible sleeve has an outer surface which may optionally bear a subbing layer of an adhesive material or primer to facilitate the adherence of the photopolymerizable layer to the sleeve. In addition, the outer surface of the sleeve may be flame treated or electron treated, e.g., corona treated. The treatment or primer layer is particularly useful when the sleeve is formed of a polymeric film.

The next step of the present invention is supplying a molten stream or sheet of photopolymerizable material onto the sleeve support. Depending upon the photopolymerizable material used, the molten stream of material is typically supplied at a temperature in a range of about 90° C. to about 180° C. A stream of molten photopolymerizable material is supplied from an extruder to a location between one of the calender rolls and the flexible sleeve supported by the sleeve support. Preferably, the photopolymerizable material is supplied as a generally cylindrically-shaped stream at about 4.5 kg/hr to about 55 kg/hr. The extruder can supply the stream of photopolymerizable at a particular location on the flexible sleeve or along the length of the sleeve. It is also contemplated that instead of supplying the photopolymerizable material from an extruder, the photo-polymerizable material can be precompounded, heated to a melt, and supplied by a delivery device at a uniform rate to the flexible sleeve.

As used herein, the term "photopolymerizable" is intended to encompass systems which are photopolymerizable, photocrosslinkable, or both. The photopolymerizable layer comprises an elastomeric binder, at least one monomer and an initiator, where the initiator has a sensitivity to actinic radiation. In most cases, the initiator will be sensitive to visible or ultraviolet radiation. Any photopolymerizable materials which are suitable for the formation of flexographic printing plates can be used for the present invention. Examples of suitable materials have been disclosed, for example, in Chen et al., U.S. Pat. No. 4,323,637;

Grüetzmacher et al., U.S. Pat. No. 4,427,749; and Feinberg et al., U.S. Pat. No. 4,894,315.

The photopolymerizable material can be prepared in many ways by mixing the binder, monomer, initiator, and other ingredients. It is preferred that the extruder be used to perform the functions of melting, mixing, deaerating, filtering the photopolymerizable material and then supplying the photopolymerizable material as a hot melt onto the flexible sleeve.

The elastomeric binder can be a single polymer or mixture of polymers which can be soluble, swellable or dispersible in aqueous, semi-aqueous or organic solvent developers, or removable by thermal absorption. Binders which are soluble or dispersible in aqueous or semi-aqueous developers have been disclosed in Alles, U.S. Pat. No. 3,458,311; Pohl, U.S. Pat. No. 4,442,302; Pine, U.S. Pat. No. 4,361,640; Inoue et al., U.S. Pat. No. 3,794,494; Proskow, U.S. Pat. No. 4,177,074; Proskow, U.S. Pat. No. 4,431,723; and Worns, U.S. Pat. No. 4,517,279. Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in Chen, U.S. Pat. No. 4,323,636; Heinz et al., U.S. Pat. No. 4,430,417; and Toda et al., U.S. Pat. No. 4,045,231 can be used. It is preferred that the binder be present in at least an amount of 65% by weight of the photosensitive layer.

The photopolymerizable material can contain a single monomer or mixture of monomers which must be compatible with the binder to the extent that a clear, non-cloudy photosensitive layer is produced. Monomers that can be used in the photopolymerizable material are well known in the art and include, but are not limited to, addition-polymerization ethylenically unsaturated compounds having relatively low molecular weights (generally less than about 30,000). Preferably, the monomers have a relatively low molecular less than about 5000. Examples of suitable monomers include, but are not limited to, t-butyl acrylate, lauryl acrylate, the acrylate and methacrylate mono- and polyesters of alcohols and polyols such as alkanols; alkylene glycols; trimethylol propane; ethoxylated trimethylol propane; pentaerythritol; dipentaerythritol; and the like. Other examples of suitable monomers include acrylate and methacrylate derivatives of isocyanates, esters, epoxides and the like. Further examples of monomers can be found in Chen, U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. It is preferred that the monomer be present in at least an amount of 5% by weight of the photopolymerizable layer.

The photoinitiator can be any single compound or combination of compounds which is sensitive to actinic radiation, generating free radicals which initiate the polymerization of the monomer or monomers without excessive termination. The photoinitiator is generally sensitive to actinic light, e.g., visible or ultraviolet radiation, preferably ultraviolet radiation. Preferably, the photoinitiator should be thermally inactive at and below 185° C. Examples of suitable photoinitiators include the substituted and unsubstituted polynuclear quinones. Examples of suitable systems have been disclosed in Grüetzmacher, U.S. Pat. No. 4,460,675 and Feinberg et al., U.S. Pat. No. 4,894,315. Photoinitiators are generally present in amounts from 0.001% to 10.0% based on the weight of the photopolymerizable material.

The photopolymerizable material can contain other additives depending on the final properties desired. Such additives include sensitizers, plasticizers, rheology modifiers, thermal polymerization inhibitors, tackifiers, colorants, antioxidants, antiozonants, or fillers.

Calendering the molten photopolymerizable material on the flexible sleeve with at least one rotating calender roll provides a layer of the photopolymerizable material with a substantially constant thickness on the flexible sleeve. An outer surface of the at least one calender roll is offset from the outer surface of the flexible sleeve by a gap which is substantially equivalent to the desired thickness of the layer of photopolymerizable material. Calendering meters the photo-polymerizable material to the desired thickness of the layer. While calendering, the process includes rotating the sleeve support which is carrying the flexible sleeve to polish an outer circumferential surface of the photopolymerizable material to a seamless uniform state without sanding, grinding or additional polishing steps to form the seamless cylindrical photosensitive element. The sleeve support is positively rotated and is not induced to rotation by the contact of the at least one rotating calender roll with the photopolymerizable material filling in the gap.

The at least one calender roll rotates at a surface speed of about 5 to 60 feet per minute (fpm). As is conventional in the art, the rate of rotation is controlled by a first motor with feedback from a sensor monitoring the rotational speed of the at least one calender roll. In both the first and second embodiments, the sleeve support rotates at a surface speed of about 3 to 75 fpm, which is controlled by a second motor with feedback from a sensor monitoring the rotational speed of the sleeve support. Thus, the rate of rotation of the at least one calendering roll and the rate of rotation of the sleeve support are independently controlled. Independently controlling the rotational speeds of the at least one calendering roll and the sleeve support provides improved uniformity of the layer of photopolymerizable material on the flexible sleeve.

The thickness of the photopolymerizable layer can vary over a wide range depending upon the type of printing element desired. The photopolymerizable layer can be from about 0.04 to 0.72 cm (17 to 285 mils) in thickness or greater.

Although the photopolymerizable material is hot when supplied to the flexible sleeve, heating of the photopolymerizable material occurs during the calendering step. One or more of the calender rolls may be heated to heat the photopolymerizable material while the layer of photopolymerizable material is being formed on the element. Preferably, there is a heating element in each of the calender rolls. Instead or in addition, one or more heating elements can be positioned outside the calender rolls. When molten photopolymerizable material is supplied to the flexible sleeve, the heating elements heat or maintain the outer surface of the calender rolls at a temperature in the range of 90° C. to 180° C., thereby heating the photopolymerizable material while it is in contact with the calender rolls. When a molten stream or sheet is feed into the apparatus, the heating elements heat the outer surface of the calender rolls so as to maintain the photosensitive material in a molten or semi-fluid state to permit metering.

Relative axial movement occurs between the sleeve support and the supply of photopolymerizable material along the longitudinal axis of the sleeve support. In all modes of relative axial movement, both the at least one calender roll and the sleeve support rotate, and the flexible sleeve is secured to the sleeve support to move together as a unitary structure. In a first mode, the sleeve support moves axially along its longitudinal axis while the supply of photopolymerizable material is axially stationary, i.e., the supply of photopolymerizable material is to a particular location on the flexible sleeve. In this mode, the at least one calender roll is axially stationary as well. In the first embodiment, the sleeve support can be moved axially by the apparatus which is holding the ends of the sleeve support. Alternately, in the second embodiment, the sleeve support can move axially along the mandrel with the aid of the bushings or lubricant at the interface of the outer surface of the mandrel and the inner circumferential surface of the sleeve support. In a second mode, the supply of photopolymerizable material moves axially along the longitudinal axis of the sleeve support while the sleeve support is axially stationary. In this mode, the at least one calender rolls moves axially along the sleeve support. Relative axial movement of the sleeve support (with the supply of photopolymerizable material) which is carrying the flexible sleeve while rotating the sleeve support provides for forming the cylindrical photosensitive element in a helical fashion.

Once formed, the seamless cylindrical photosensitive element may undergo one or more additional steps to include one or more layers on the seamless photopolymerizable layer. The element may include additional layers conventional in the art on the photopolymerizable layer, such as, for example, release layers as disclosed by Chen et al., in U.S. Pat. No. 4,423,135, and capping layers as disclosed by Gr üetzmacher et al., in U.S. Pat. Nos. 4,427,759 and 4,460,675. The photosensitive element may also include an infrared-sensitive layer as disclosed by Fan in U.S. Pat. No. 5,262, 275 and by Fan in EPO Publication 816920. Any additional layers on the seamless photopolymerizable layer should also be seamless.

Such seamless cylindrical photopolymerizable elements are well-suited for mounting on conventional rotating drum mounted equipment. Thus, imagewise exposure by laser ablation or overall exposure, development and any additional process steps can be performed while the element is in cylindrical form. Conducting exposure. and processing steps with a cylindrical element may provide additional advantages including increased process speed, better registration and reduced or in some cases no extra mounting time, reduced press-ready time, and increased press printing speed. In particular, the cylindrical photopolymerizable element is well-suited for mounting on conventional laser exposure equipment in which the element can be mounted directly on the drum or replace the drum (with, for example, cones supporting each end of the element) for the laser exposure step. Exposure by a laser offers additional advantages of digitally imaging the cylindrical photopolymerizable element by laser ablation of an infrared sensitive coating on the element as disclosed by Fan in U.S. Pat. No. 5,262,275, or by laser engraving of the element as disclosed by Cushner et al. in International Publications WO 93/23252 and WO 93/23253.

In addition, the continuous photopolymerizable element can be overall exposed to actinic radiation to polymerize the photopolymerizable layer, and the resulting element can be used as a thick sleeve or a sleeve with a cushion layer or as a laser engravable printing sleeve. Such a thick sleeve or cushioned element is useful for supporting another photopolymerizable layer or a relief plate in certain printing applications.

What is claimed is:

1. A method for forming a seamless cylindrical photosensitive element on a flexible cylindrical sleeve, comprising:

supporting the sleeve on a substantially rigid and thermally stable sleeve support such that the sleeve and sleeve support act as a unitary structure, the sleeve support having a longitudinal axis and adapted to be mounted onto a mandrel;

supplying a substantially molten stream of photopolymerizable material onto the sleeve;

providing relative axial movement between the sleeve support and the supply of photopolymerizable material along the longitudinal axis of the sleeve support;

calendering the molten photopolymerizable material on the sleeve by metering with at least one rotating calender roll the photopolymerizable material to have a substantially constant thickness on the sleeve and rotating the sleeve support whereby the providing, calendering and rotating steps polish an outer circumferential surface of the material to a seamless uniform state without sanding, grinding or additional polishing steps, thereby forming the seamless cylindrical photosensitive element; and during the calendering step, heating the photopolymerizable material.

2. The method of claim 1 further comprising the step of mounting the sleeve support onto a mandrel.

3. The method of claim 2 wherein the sleeve support has an axial length shorter than an axial length of the mandrel.

4. The method of claim 1 wherein the sleeve support has opposing ends disposed along the longitudinal axis and further comprising the step of supporting the sleeve support at each end.

5. The method of claim 1 further comprising the step of controlling the temperature of the sleeve support.

6. The method of claim 5 further comprising the step of cooling the sleeve support.

7. The method of claim 1 wherein the step of providing relative axial movement comprises moving the sleeve support and sleeve together along the longitudinal axis while the supply of photopolymerizable material is axially stationary.

8. The method of claim 1 wherein the step of providing relative axial movement comprises moving the supply of photopolymerizable material along the longitudinal axis while the sleeve support and sleeve are axially stationary.

9. The method of claim 8 further comprising the step of moving the at least one rotating calender roll along the longitudinal axis.

10. The method of claim 1 wherein the seamless cylindrical photosensitive element has an axial length which is greater than an axial length of the at least one calender roll.

11. The method of claim 1 wherein the at least one calender roll has a rate of rotation and the sleeve support has a rate of rotation, the method further comprising independently controlling the rate of rotation of the calender roll from the rate of rotation of the sleeve support.

12. The method of claim 1 further comprising forming the cylindrical photosensitive element in a helical fashion.

13. In a method for forming a seamless cylindrical photosensitive element on a flexible cylindrical sleeve including supplying a substantially molten stream of photopolymerizable material onto the sleeve, calendering the molten photopolymerizable material on the sleeve by metering with at least one rotating calender roll the photopolymerizable material to have a substantially constant thickness on the sleeve and rotating the sleeve to polish an outer circumferential surface of the material to a seamless uniform state without sanding, grinding or additional polishing apparatus, and heating the photopolymerizable material during the calendering step, the improvement comprising:

supporting the sleeve on a substantially rigid and thermally stable sleeve support such that the sleeve and sleeve support act as a unitary structure, the sleeve support having a longitudinal axis and adapted to be mounted onto a mandrel; and providing relative axial movement between the sleeve support and the supply of photopolymerizable material along the longitudinal axis of the sleeve support.

14. An intermediate element for making a seamless cylindrical printing element comprising:

a) a hollow cylindrical sleeve of at least one polymeric film mounted onto a substantially rigid and thermally stable sleeve support for maintaining the sleeve in a substantially cylindrical shape, the sleeve support adapted to be mounted onto a mandrel; and b) at least one seamless layer of a photopolymerizable material on an exterior surface of the sleeve.

15. The intermediate element of claim 14 further comprising an adhesive layer disposed between the sleeve and the at least one seamless layer.

16. The intermediate element of claim 14 wherein an exterior surface of the sleeve has an adhesion promoting surface.

\* \* \* \* \*